United States Patent
Ning et al.

(10) Patent No.: US 6,440,753 B1
(45) Date of Patent: Aug. 27, 2002

(54) METAL HARD MASK FOR ILD RIE PROCESSING OF SEMICONDUCTOR MEMORY DEVICES TO PREVENT OXIDATION OF CONDUCTIVE LINES

(75) Inventors: Xian J. Ning, Mohegan Lake; Joachim Nuetzel, Fishkill, both of NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/824,596

(22) Filed: Apr. 2, 2001

Related U.S. Application Data
(60) Provisional application No. 60/263,991, filed on Jan. 24, 2001.

(51) Int. Cl.[7] .............................................. H01L 21/467
(52) U.S. Cl. .......................... 438/3; 438/637; 438/736; 438/737; 438/945
(58) Field of Search ............................. 438/637, 3, 736, 438/945, 737

(56) References Cited

U.S. PATENT DOCUMENTS

| | | | |
|---|---|---|---|
| 5,447,887 A | | 9/1995 | Filipiak et al. |
| 5,640,343 A | | 6/1997 | Gallagher et al. |
| 5,814,867 A | * | 9/1998 | Saito ........................ 257/379 |
| 5,838,608 A | | 11/1998 | Zhu et al. |
| 5,861,328 A | * | 1/1999 | Tehrani et al. ............. 438/210 |
| 6,127,045 A | | 10/2000 | Gill |
| 6,162,587 A | * | 12/2000 | Yang et al. ................. 430/314 |
| 6,287,975 B1 | * | 9/2001 | DeOrnellas et al. ........ 438/710 |
| 6,291,251 B1 | * | 9/2001 | Nam ............................. 438/3 |
| 2001/0038972 A1 | * | 11/2001 | Lyons et al. ............... 430/313 |

OTHER PUBLICATIONS

N. Aoi et al., "A Novel Clustered Hard Mask Technology for Dual Damascene Multilevel Interconnects with Self--Aligned Via Formation Using an Organic Low k Dielectric," IEEE Digest of Technical Papers from 1999 Symposium on VLSI Technology, pp. 41–42.*

Gary A. Prinz, Magnetoelectronics applications, Journal of Magnetism and Magnetic Materials 200 (1999) 57–68.

Jo De Boeck, et al., Magnetoelectronic Devces, IEDM 99 Technical Digest, Dec. 1999, pp. 215–218.

Stanley Wolf, et al., Silicon Processing for the VLSI Era, vol. 1: Process Technology, Second Edition, Lattice Press, Sunset Beach, CA (2000), pp. 775–780, 797–801.

* cited by examiner

*Primary Examiner*—Keith Christianson
*Assistant Examiner*—Stephen W. Smoot
(74) *Attorney, Agent, or Firm*—Slater & Matsil, L.L.P.

(57) ABSTRACT

A method of patterning conductive lines (252) of a memory array integrated circuit (200) using a hard mask (244) and reactive ion etching (RIE). Using a hard mask (244) prevents oxidation of underlying conductive lines (210).

23 Claims, 2 Drawing Sheets

METAL HARD MASK FOR ILD RIE PROCESSING OF SEMICONDUCTOR MEMORY DEVICES TO PREVENT OXIDATION OF CONDUCTIVE LINES

This patent claims the benefit of U.S. Provisional Patent Application Ser. No. 60/263,991, filed Jan. 24, 2001, which is incorporated herein by reference.

TECHNICAL FIELD

The present invention relates generally to the fabrication of semiconductor integrated circuit (IC) devices, and more particularly to magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use an electron charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAMs can be made smaller and provide a non-volatile memory.

For example, a personal computer (PC) utilizing MRAMs would not have a long "boot-up" time as with conventional PCs that utilize DRAMs. MRAMs permit the ability to have a memory with more memory bits on the chip than DRAMs or flash memories. Also, an MRAM does not need to be powered up and has the capability of "remembering" the stored data.

DRAMs differ from MRAMs in that, in a DRAM, a capacitor is typically used to store a charge indicative of the logic state, and an access field effect transistor (FET) is used to access the storage capacitor. The capacitors and FETs are manufactured within a substrate in the front-end-of-line (FEOL). In the back-end-of-line, (BEOL), metallization layers and via interconnect layers are formed on the substrate, to make electrical contact to the underlying storage capacitors, FETs and other active components on the DRAM.

MRAMs present some manufacturing challenges because in an MRAM, the storage cells comprising magnetic stacks must be manufactured in the BEOL. This is because the magnetic stacks must be electrically coupled to underlying and overlying conductive lines, which are manufactured in the BEOL.

Copper interconnects have been proposed for use in MRAM ICs due to their excellent conductive properties (e.g., low resistance), which enhance performance. However, copper oxidizes easily, which can be problematic, as described further herein.

During the formation of contact vias or trenches, copper conductive lines may be exposed in some areas.

For example, a wafer may be exposed to an oxygen plasma environment to strip a resist that is used to pattern the wafer. Exposed copper material oxidizes during a resist strip process and will form an oxide comprised of copper oxide on the surface thereof, for example. The formation of an oxide on copper conductive lines may be undesirable, because in certain semiconductor devices, copper conductive lines must make electrical contact to subsequently deposited layers and/or conductive lines. The presence of an oxide on a copper conductive line prevents electrical contact of conductive line with subsequently deposited conductive lines.

The problem of oxidizing first conductive lines during the formation of trenches for second conductive lines is particularly problematic in the manufacture of MRAMs and other magnetic memory devices because magnetic memory cells must be formed in contact with metallization layers comprising the first and second conductive lines in an array region of the wafer, while simultaneously forming conductive lines in a non-array region of the wafer.

Another problem with forming trenches and vias for conductive lines of a magnetic memory array is that etch processes to remove cap and liner layers of magnetic stacks or memory cells may erode the dielectric layer the trenches are being formed in, distorting the original pattern of the trenches. This is undesirable, as potential shorts can occur between underlying conductive lines and subsequently formed conductive lines.

What is needed in the art is a semiconductor device and method of fabrication thereof that reduces or prevents oxidation and/or shorts of copper conductive lines.

SUMMARY OF THE INVENTION

A preferred embodiment of the present invention achieves technical advantages as method of patterning conductive lines of a magnetic memory array that prevents oxidation of the conductive line material by using a hard metal mask rather than resist.

Disclosed is a method of manufacturing a semiconductor memory device, comprising forming first conductive lines over a substrate, and forming memory cells over the first conductive lines, where the first conductive lines are electrically coupled to the memory cells. A dielectric layer is deposited over the memory cells, and a hard metal mask is deposited over the dielectric layer. The dielectric layer is patterned with the hard metal mask to form trenches within the dielectric layer.

Also disclosed is a method of manufacturing a semiconductor memory device, comprising depositing a first dielectric layer over a substrate, forming first conductive lines within the first dielectric layer, and forming memory cells over the first conductive lines, where the first conductive lines are electrically coupled to the memory cells. A second dielectric layer is deposited between the memory cells, and a third dielectric layer is deposited over the second dielectric layer and the memory cells. A hard metal mask is deposited over the third dielectric layer, and a resist is deposited over the hard metal mask. The resist is patterned, and the hard metal mask is patterning with the resist. The resist is removed, and the third dielectric layer is patterned with the hard metal mask to form trenches for second conductive lines.

Advantages of a preferred embodiment of the invention include the ability to form second conductive lines of a memory IC without oxidizing underlying first conductive lines of the device. This is particularly advantageous in IC's that use copper for the conductive line material, because copper easily oxidizes. A preferred embodiment of the invention is particularly beneficial in IC's having different metallization layers that must make electrical contact, particularly in devices where a magnetic memory array is formed in one region, and typical electrical connections are made between metallization layers in non-memory array regions.

Another advantage includes achieving a more accurate pattern of second conductive line trenches, preventing shorts.

The method and structure described herein may be used and applied to a variety of semiconductor devices, including memory integrated circuits, such as MRAM's, DRAM's and FRAM's.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention will be discussed, followed by a discussion of some advantages of the invention.

FIGS. 1–6 show a process for fabricating an MRAM IC 200 in accordance with the present invention. In one embodiment, the IC 200 comprises an MRAM IC having copper interconnects 210/252, although the present invention is useful in other types of IC's having copper interconnects.

Figure 1:
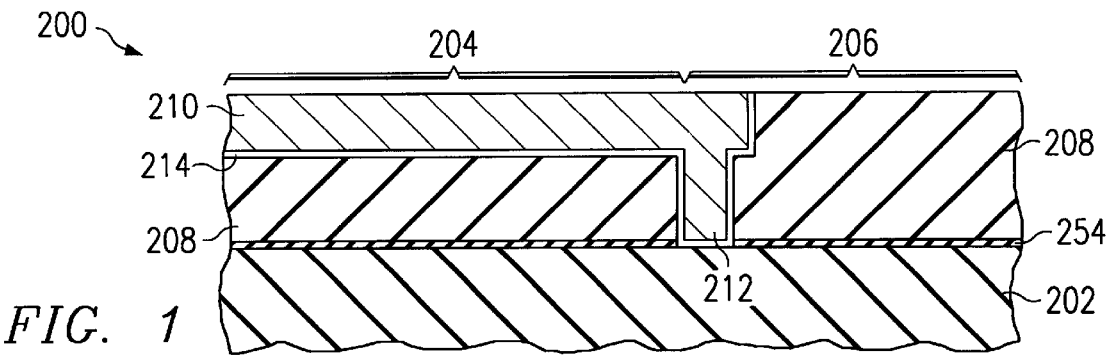
FIGS. 1–6 show an MRAM IC in accordance with an embodiment of the present invention at various stages of fabrication.

Referring first to FIG. 1, a prepared substrate 202 with a first ILD layer 208 deposited thereon is provided. The substrate 200 comprises array and non-array regions 204 and 206, respectively. The ILD layer 208 may be adjacent first conductive lines 210 and vias 212 that connect the first conductive lines 210 to underlying circuit elements (not shown), for example. Other components that are not shown may be included in the substrate non-array region 206. The first ILD layer 208 preferably comprises a dielectric such as silicon dioxide, for example. ILD layer 208 may alternatively comprise other types of suitable dielectric materials, such as Silk™, fluorinated silicon glass, FOX™, as examples.

A plurality of first conductive lines 210 are formed within the first ILD layer 208 using a damascene process, for example. Preferably, first conductive lines 210 in the array region 204 run in a first direction and serve as bitlines or wordlines of the memory array in the array region 204. Typically, the first conductive lines 210 are located on a first or second metal level (M1 or M2 level) of the IC 200.

Figure 2:
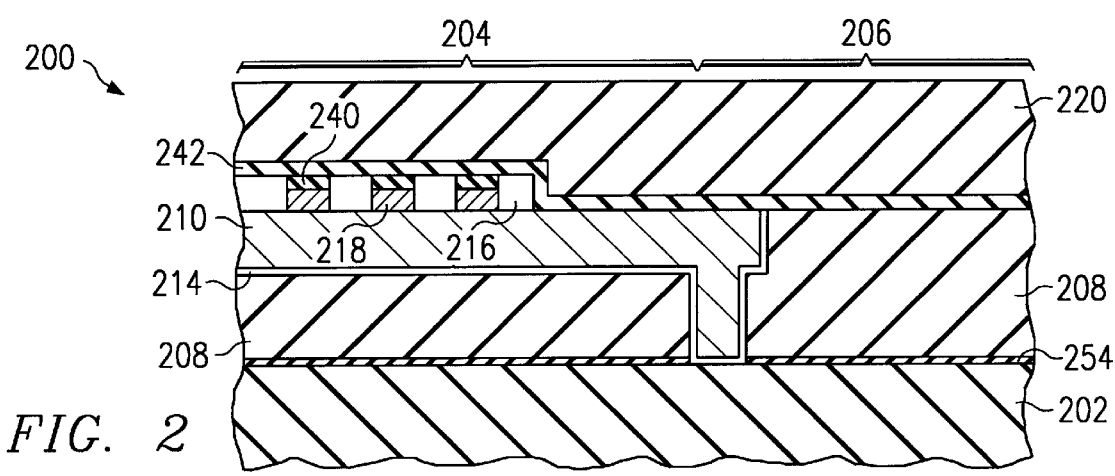

Referring to FIG. 2, memory cell material 218 is deposited over dielectric layer 208 and conductive lines 210. In one embodiment, the memory cell material 218 comprises magnetic stack material in the array region 204. The magnetic stack material 218 may comprise, for example, a plurality of layers comprising PtMn, CoFe, Ru, $Al_2O_3$, NiFe, although other types of suitable magnetic materials may be used sandwiched around an insulating layer. The magnetic stacks 218 preferably comprise a bottom layer comprising several layers of magnetic materials, an insulating layer comprising $Al_2O_3$ for example, the insulating layer providing a tunnel junction (TJ). A top layer comprising several layers of magnetic materials is formed over the insulating layer. Various techniques, such as physical vapor deposition (PVD), evaporation, and chemical vapor deposition (CVD) may be used to deposit the various magnetic and insulating layers. Because each layer of magnetic material is very thin, e.g., less than 100 Angstroms, the magnetic material deposition preferably is by PVD, although other methods may be used. The magnetic stack 218 bottom magnetic layer is coupled to and makes electrical contact with the conductive lines 210 which may comprise wordlines, for example.

In accordance with the present invention, a layer 240 is deposited over the magnetic stacks 218. The layer 240 serves as hard mask for the magnetic stack 218 etch. The hard mask layer 240 may comprise, for example, an oxide cap comprising silicon oxide. Alternatively, the hard mask layer 240 may comprise other materials such as TiN, W, TaN, Ta, as examples. The hard mask layer 240 and magnetic layers are then patterned to form magnetic stacks 218. A resist (not shown) may be deposited and patterned with the magnetic stack pattern, and the pattern transferred to the hard mask layer 240. The resist is removed and the hard mask layer 240 is used to pattern the magnetic stack material 218.

Next, a dielectric layer 216, such as silicon nitride, is deposited over the magnetic stacks 218, filling the spaces between the magnetic stacks 218. The wafer 200 is planarized by, for example, chemical-mechanical polishing (CMP) using the hard mask layer or oxide cap 240 as a polish stop. The CMP process removes excess silicon nitride 216 to provide a planar surface which is co-planar with the silicon oxide cap 240.

A photo-lithography and etch process (not shown) are used to remove layer 216 in non-array region 206. Then a dielectric liner 242 is deposited over the magnetic stacks 218, conductive lines 210, and dielectric 208. The dielectric liner 242 preferably comprises silicon nitride and alternatively may comprise silicon carbide, for example. The dielectric liner 242 may be, for example, about 300 Angstroms thick. The dielectric liner 242 serves as an etch stop layer for subsequent processing steps.

A dielectric layer 220 is deposited over the dielectric liner 242, as shown in FIG. 2. The dielectric layer 220 serves as an ILD layer. The dielectric layer 220 preferably comprises, for example, silicon oxide. Alternatively, dielectric layer 220 may comprise other dielectric materials such as Silk™, fluorinated silicon glass, FOX™, as examples. The surface of the dielectric layer 220 is planarized, for example, by CMP to provide a planar dielectric layer 220 upper surface.

Figure 3:
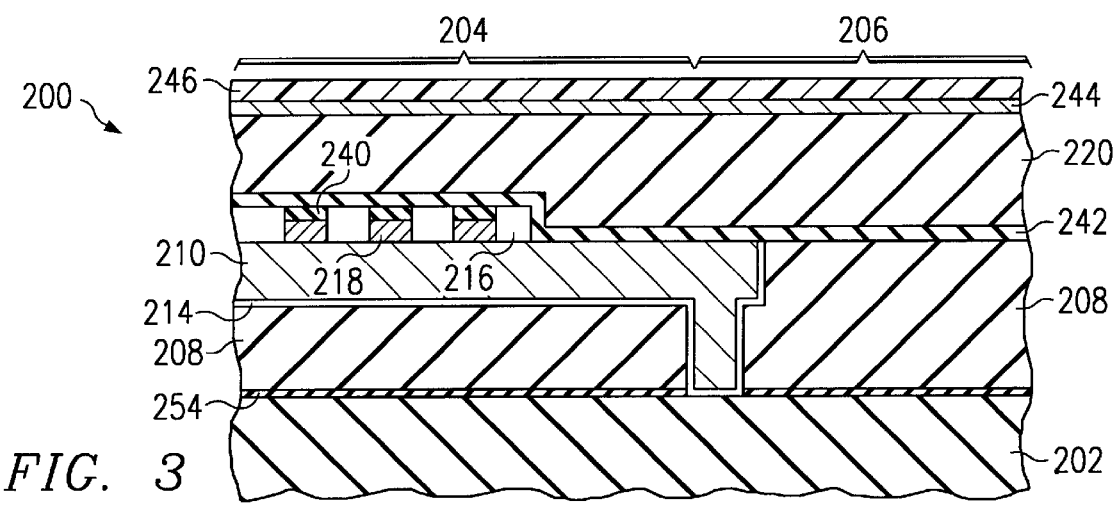

In accordance with an embodiment of the invention, a hard mask 244 is deposited over the dielectric layer 220, as shown in FIG. 3. The hard mask 244, in one embodiment, comprises TaN, for example. In another embodiment, the hard mask 244 comprises TiN. Hard mask 244 may alternatively comprise other types of hard mask materials such as Ta, W, Si, WSi, as examples. Preferably, the hard mask 244 thickness is about 500 Angstroms, for example. The hard mask may be deposited by various techniques known in the art, including, for example, PVD, CVD, laser or electron beam evaporation. A resist layer 246 is deposited over the hard mask layer 244.

Figure 4:
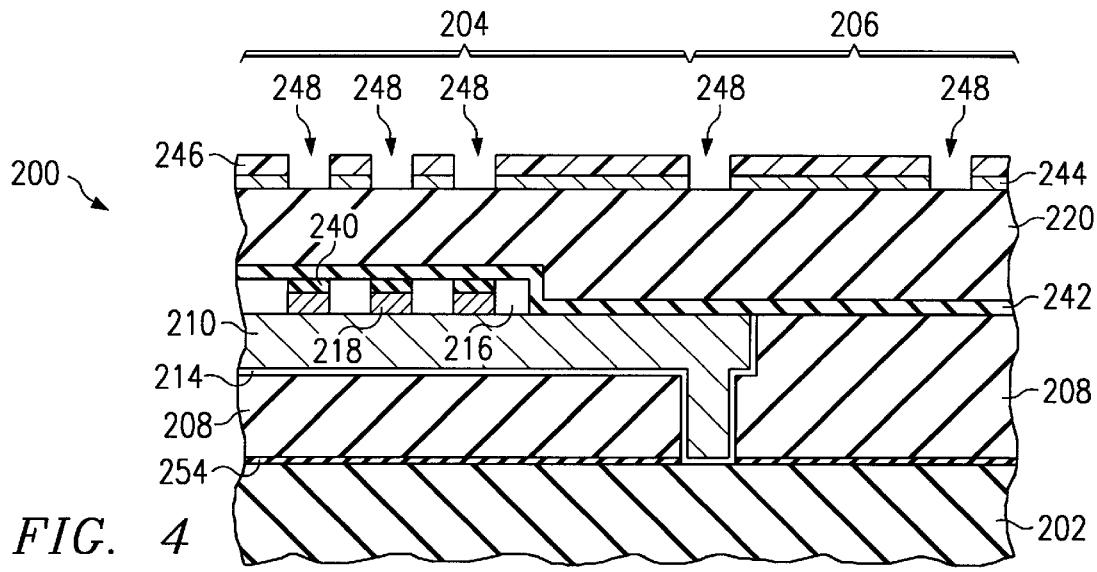

Referring to FIG. 4, the resist layer 246 is patterned to form openings 248. Openings 248 comprise a pattern for conductive lines that will be subsequently formed. The resist layer 246 is patterned by selectively exposing the resist 246 to radiation and developing it with a developer to remove either the exposed or unexposed portions of the resist, depending whether a positive or negative type resist is used.

Using the patterned resist layer 246 as an etch mask, the hard mask layer 244 is patterned to expose portions of the underlying dielectric layer 220. For example, an RIE can be employed to pattern the hard mask layer 244. The chemistry of the RIE depends on the material of the hard mask. For example, for a TaN hard mask 244, $Cl_2$, $BCl_3$, $N_2$, $O_2$, and Ar chemistries may be used.

Figure 5:
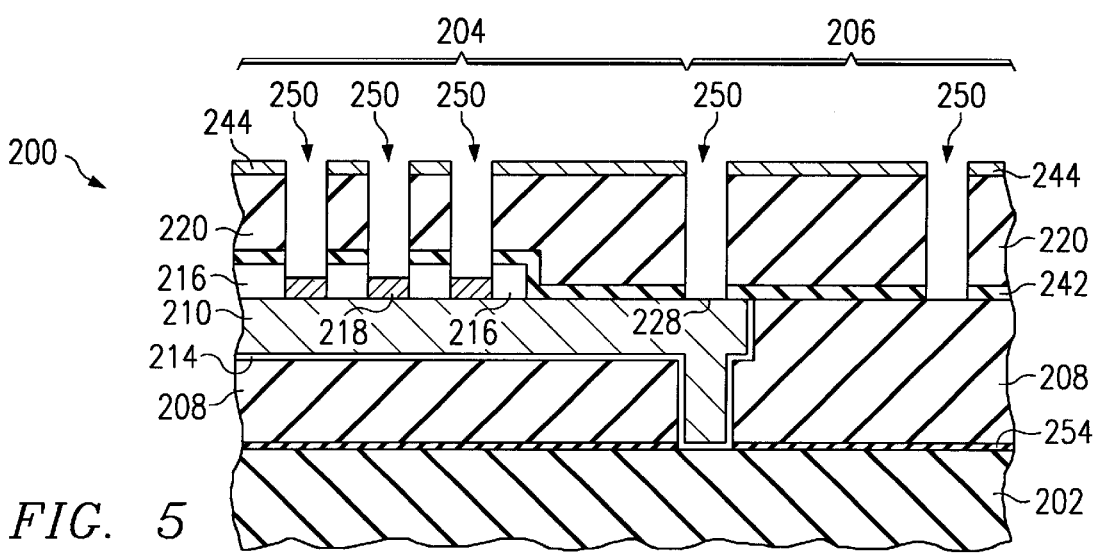

Referring to FIG. 5, the resist layer 246 is removed after the hard mask 244 is patterned. The patterned hard mask layer 244 serves as an etch mask for removal of the dielectric layer 220, oxide cap 240 and dielectric liner 242 to form conductive line trenches and contact vias 250. Preferably, an RIE is used to form trenches 250. During the formation of trenches 250, conductive lines 210 are not exposed to oxygen, in accordance with the preferred embodiment of the present invention, preventing the formation of an oxide over the exposed conductive lines 210.

For example, if a resist had been used to pattern the trenches 250, then upon exposure to an oxygen environment while removing a resist, copper line 210 would have oxidized in region 228, preventing electrical contact to subsequently formed conductive lines. This oxidation problem is alleviated by the use of the preferred embodiment of the present invention.

Figure 6:
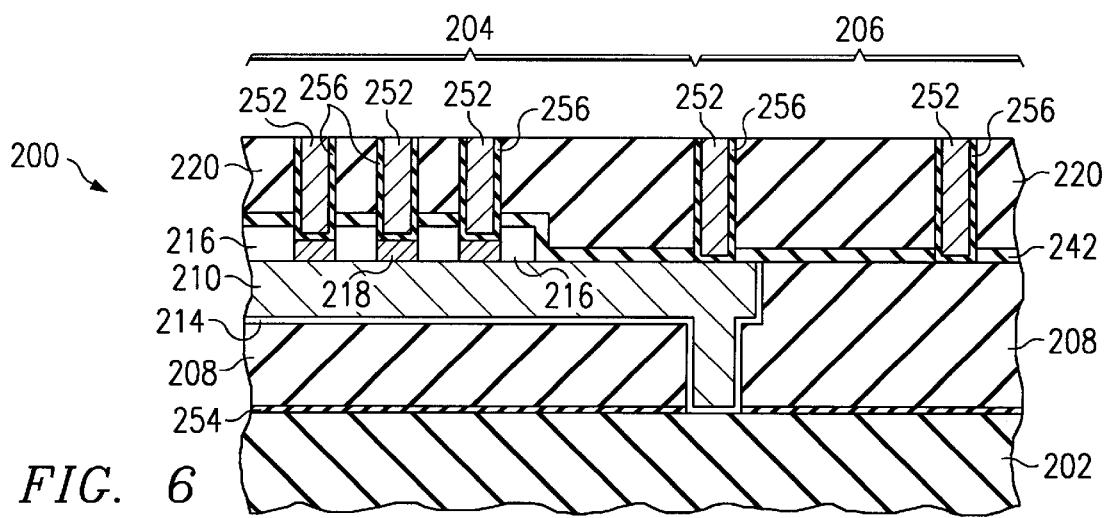

Referring to FIG. 6, the hard mask layer 244 left on top of ILD 220 is removed during the metal planarization processes described later. By using the metal hard mask 244 to pattern trenches 250, the process avoids oxidizing the exposed copper conductive lines 210 caused by the resist strip chemistry and erosion of the dielectric layer 220, especially the corner of trenches 250, which can be problematic.

A conductive material 252 is deposited over the wafer 200, filling the trenches and contact holes 250 to form second conductive lines 252. In the array region 204, the upper and lower conductive lines 210/252 may be positioned orthogonal to each other and serve as bitlines and wordlines of the memory array. The memory cells 218 are located at the intersections of bitlines and wordlines.

The conductive layer 252 may comprise, for example, copper, although other conductive materials may alternatively be used. A liner 256 preferably comprising a layer of Ta and a layer of TaN, and alternatively comprising, for example, W, Cr, or TiN, may be formed between the dielectric layer and conductive material 252. A planarization process such as CMP is used to remove the excess conducting materials 252/256 outside the trenches 250. The planarization process stops at and is coplanar at the surface of ILD layer 220. Advantageously, this planarization process also removes the metal hard mask layer 244. Subsequent processes are performed to complete processing of the MRAM IC 200.

Advantages of preferred embodiments of the present invention include the ability to form second conductive lines 252 of a memory IC 200 without oxidizing underlying first conductive lines 210 of the device 200 in region 228. This is particularly advantageous in IC's that use copper for the conductive line 210 material, because copper easily oxidizes. The invention is particularly beneficial in IC's having different metallization layers that must make electrical contact, particularly in devices where a magnetic memory array is formed in one region 204, and typical electrical connections are made between metallization layers in non-memory array regions 206.

Another advantage includes achieving a more accurate pattern of second conductive line 252 trenches 250, preventing shorts, which is problematic when portions of dielectric 220 are etched away when trenches 250 are formed.

In one embodiment of the present invention, the conductive lines 210/252 comprise copper or a copper alloy. Alternatively, other types of conductive material, such as W and Al, may also be used to form the conductive lines 210/252, although the present invention is particularly useful in preventing oxidation problems associated with the use of copper for conductive lines 210/252, because copper easily oxidizes.

Conductive lines 210/252 may be formed using conventional damascene or reactive ion etch (RIE) techniques, as examples. The conductive lines 210/252 may include a liner 214/256, respectively, deposited prior to the copper 210/252 deposition. Liners 214/256 preferably comprise Ta, TaN, TiN, Cr or W, or multiple layers thereof, as examples. Liners 214/256 promote adhesion of the copper conductive lines 210/252 to dielectric 208/220, respectively, prevent the copper conductive lines 210/252 from oxidizing, and prevent the diffusion of the metal 210/252 to the dielectric 208/220 the conductive lines 210/252 are embedded in.

A dielectric liner 254 may be deposited over the substrate 202 as shown in FIGS. 1–6. Dielectric liner 254 may comprise silicon nitride, for example, and may alternatively comprise silicon carbide.

The present invention is described herein with reference to silicon material. Alternatively, compound semiconductor materials such as GaAs, InP, Si/Ge, or SiC may be used in place of silicon, as examples.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a semiconductor memory device, comprising:
   forming first conductive lines over a substrate;
   forming memory cells over the first conductive lines, the first conductive lines electrically coupled to the memory cells;
   depositing a dielectric layer over the memory cells;
   depositing a hard metal mask over the dielectric layer; and
   patterning at least the dielectric layer with the hard metal mask to form trenches within the dielectric layer.

2. The method according to claim 1 further comprising:
   depositing a conductive material in the trenches over at least the memory cells to form second conductive lines, wherein the second conductive lines are electrically coupled to the memory cells.

3. The method according to claim 2, further comprising:
   chemically-mechanically polishing the memory device wafer surface to remove the second conductive layer from a surface of the dielectric layer.

4. The method according to claim 3, wherein the hard metal mask is removed during the chemical-mechanical polish.

5. The method according to claim 2, wherein the substrate comprises array regions and non-array regions, wherein forming the memory cells comprises forming memory cells over the substrate array regions, wherein forming the second conductive lines includes forming second conductive lines electrically coupled to first conductive lines in the substrate non-array regions.

6. The method according to claim 1, further comprising:
   depositing a resist over the hard metal mask;
   patterning the hard metal mask with the resist; and
   removing the resist.

7. The method according to claim 1, wherein forming the memory cells comprises forming magnetic stacks of a magnetic random access memory (MRAM).

8. The method according to claim 1 wherein depositing a hard metal mask comprises depositing TaN or TiN.

9. The method according to claim 1 wherein depositing a hard metal mask comprises depositing about 500 Angstroms of a metal containing nitrogen.

10. The method according to claim 1, further comprising:
    depositing an oxide layer over the memory cells, wherein portions of the oxide layer are removed during the patterning of the dielectric layer with the hard metal mask.

11. The method according to claim 1, further comprising:
    depositing a nitride layer over the memory cells, wherein portions of the nitride layer are removed during the patterning of the dielectric layer with the hard metal mask.

12. The method according to claim 1, wherein the patterning is by reactive ion etching (RIE).

13. A method of manufacturing a semiconductor memory device, comprising:
    depositing a first dielectric layer over a substrate;
    forming first conductive lines within the first dielectric layer;
    forming memory cells over the first conductive lines, the first conductive lines electrically coupled to the memory cells;
    depositing a second dielectric layer between the memory cells;
    depositing a third dielectric layer over the second dielectric layer and memory cells;
    depositing a hard metal mask over the third dielectric layer;
    depositing a resist over the hard metal mask;
    patterning the resist;
    patterning the hard metal mask with the resist;
    removing the resist;
    patterning at least the third dielectric layer with the hard metal mask to form trenches for second conductive lines; and
    depositing a conductive layer in the trenches over at least the memory cells to form second conductive lines, wherein the second conductive lines are electrically coupled to the memory cells.

14. The method according to claim 13, further comprising:
    chemically-mechanically polishing the memory device wafer surface to remove the conductive layer from the top surface of the third dielectric layer.

15. The method according to claim 14, wherein the hard metal mask is removed during the chemical-mechanical polish.

16. The method according to claim 13, wherein forming the memory cells comprises forming magnetic stacks of a magnetic random access memory (MRAM).

17. The method according to claim 16, wherein forming the first conductive lines comprises forming wordlines and wherein forming the second conductive lines comprises forming bitlines.

18. The method according to claim 13, wherein depositing a hard metal mask comprises depositing TaN or TiN.

19. The method according to claim 13 wherein depositing a hard metal mask comprises depositing 500 Angstroms of a metal containing nitride.

20. The method according to claim 13, wherein the substrate comprises array regions and non-array regions, wherein forming the memory cells comprises forming memory cells over the substrate array regions, wherein forming the second conductive lines includes forming second conductive lines electrically coupled to first conductive lines in the substrate non-array regions.

21. The method according to claim 13, further comprising:
    depositing an oxide layer over the memory cells, wherein portions of the oxide layer are removed during the patterning of the third dielectric layer with the hard metal mask.

22. The method according to claim 13, further comprising:
    depositing a nitride layer over the memory cells, wherein portions of the nitride layer are removed during the patterning of the third dielectric layer with the hard metal mask.

23. The method according to claim 13, wherein the patterning of the third dielectric layer is by reactive ion etching (RIE).

* * * * *